United States Patent
Jang

(10) Patent No.: US 10,109,699 B2
(45) Date of Patent: Oct. 23, 2018

(54) ORGANIC LIGHT EMITTING DISPLAY PANEL

(71) Applicant: SAMSUNG DISPLAY CO., LTD., Yongin-si, Gyeonggi-do (KR)

(72) Inventor: Woo-seok Jang, Suwon-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 111 days.

(21) Appl. No.: 14/995,219

(22) Filed: Jan. 14, 2016

(65) Prior Publication Data

US 2016/0233287 A1    Aug. 11, 2016

(30) Foreign Application Priority Data

Feb. 9, 2015  (KR) .................. 10-2015-0019695

(51) Int. Cl.
*H01L 27/32*    (2006.01)

(52) U.S. Cl.
CPC ...... *H01L 27/3276* (2013.01); *H01L 27/3279* (2013.01)

(58) Field of Classification Search
CPC .................. H01L 27/3276; H01L 27/3279
See application file for complete search history.

(56) References Cited

U.S. PATENT DOCUMENTS

| | | | |
|---|---|---|---|
| 8,772,928 B2 | 7/2014 | Lin et al. | |
| 2009/0109150 A1 | 4/2009 | Han et al. | |
| 2016/0358545 A1* | 12/2016 | Yin | .............. G09G 3/3233 |

FOREIGN PATENT DOCUMENTS

| | | |
|---|---|---|
| KR | 10-0669726 B1 | 1/2007 |
| KR | 10-2010-0036645 A | 4/2010 |
| KR | 10-2011-0138020 A | 12/2011 |
| KR | 10-2014-0072438 A | 6/2014 |
| KR | 10-2014-0087906 A | 7/2014 |

* cited by examiner

*Primary Examiner* — Douglas Menz
(74) *Attorney, Agent, or Firm* — Lee & Morse, P.C.

(57) ABSTRACT

An organic light-emitting display panel includes a plurality of pixel columns, a plurality of first signal lines, and a plurality of second signal lines. Each of the pixel columns includes a plurality of organic light-emitting pixels. The first signal lines are arranged to correspond to the pixel columns. Each of the first signal lines connected to the organic light-emitting pixels of a corresponding pixel column. The second signal lines are respectively connected to the first signal lines and provide a first power supply voltage to corresponding ones of the first signal lines. Each of the second signal lines is connected substantially to a center portion of the corresponding first signal line.

6 Claims, 7 Drawing Sheets

ORGANIC LIGHT EMITTING DISPLAY PANEL

CROSS-REFERENCE TO RELATED APPLICATION

Korean Patent Application No. 10-2015-0019695, filed on Feb. 9, 2015, and entitled, "Organic Light Emitting Display Panel," is incorporated by reference herein in its entirety.

BACKGROUND

1. Field

One or more embodiments described herein relate to an organic light-emitting display panel.

2. Description of the Related Art

An organic light-emitting display panel has pixels which include organic light-emitting devices. Each organic light-emitting device is equipped with electrodes for applying a power supply voltage to an organic emission layer. Various types of wirings may be used to apply the power supply voltage. The wirings have a certain resistance. As a result, when current flows through the wirings, a voltage drop phenomenon may occur due to the resistance. The effects may become more pronounced with the size of the display panel.

SUMMARY

In accordance with one or more embodiments, an organic light-emitting display panel includes a plurality of pixel columns, each of the pixel columns including a plurality of organic light-emitting pixels; a plurality of first signal lines arranged to correspond to the pixel columns, each of the first signal lines connected to the organic light-emitting pixels of a corresponding pixel column; and a plurality of second signal lines respectively connected to the first signal lines, the second signal lines to provide a first power supply voltage to corresponding ones of the first signal lines, wherein each of the second signal lines is connected substantially to a center portion of the corresponding first signal line.

A distance between the center portion and an end point of the first signal line may be about 40 percent to about 60 percent of a length of the first signal line. Each of the organic light-emitting pixels may include an organic light-emitting device to receive the first power supply voltage and a second power supply voltage different from the first power supply voltage in order to emit light. The second power supply voltage may be lower than the first power supply voltage. The display panel may include a plurality of data lines to provide data signals corresponding to the organic light-emitting pixels; and a plurality of gate lines intersecting and insulated from the data lines, the gate lines to provide gate signals corresponding to the organic light-emitting pixels.

In accordance with one or more other embodiments, an organic light-emitting display panel includes a plurality of pixel columns, each of the pixel columns including a first pixel group which includes a plurality of organic light-emitting pixels and a second pixel group which includes a plurality of organic light-emitting pixels; a plurality of first signal lines arranged to correspond to the first pixel group, each of the first signal lines connected to the organic light-emitting pixels of the first pixel group; a plurality of second signal lines arranged to correspond to the second pixel group, each of the second signal lines connected to the organic light-emitting pixels of the second pixel group; and a plurality of third signal lines respectively connected to the first signal lines and the second signal lines to provide a first power supply voltage to corresponding ones of the first signal lines and corresponding ones of the second signal lines, each of the third signal lines connected substantially to a center portion of a corresponding one of the first signal lines and to a center portion of a corresponding one of the second signal lines.

The organic light-emitting pixels of the first pixel group may be adjacent to each other, and the organic light-emitting pixels of the second pixel group may be adjacent to each other. A distance between the center portion of the first signal line and an end point of the first signal line may be about 40 percent to about 60 percent of a length of the first signal line. A distance between the center portion of the second signal line and an end point of the second signal line may be about 40 percent to about 60 percent of a length of the second signal line.

Each of the organic light-emitting pixels may include an organic light-emitting device to receive the first power supply voltage and a second power supply voltage different from the first power supply voltage in order to emit light. The second power supply voltage may be lower than the first power supply voltage.

In accordance with one or more other embodiments, an organic light-emitting display panel includes a first display area to display an image and a second display area to display an image, the second display area adjacent to the first display area, wherein the first display area includes: a plurality of first pixel columns, each of the first pixel columns including a plurality of organic light-emitting pixels; a plurality of first signal lines arranged to correspond to the first pixel columns, each of the first signal lines connected to the organic light-emitting pixels of the first pixel column; and a plurality of second signal lines respectively connected to the first signal lines, each of the second signal lines to provide a first power supply voltage to a corresponding one of the first signal lines, each of the second signal lines connected substantially to a center portion of a corresponding one of the first signal lines, wherein the second display area includes: a plurality of second pixel columns, each of the second pixel columns including a plurality of organic light-emitting pixels; a plurality of third signal lines arranged to correspond to the second pixel columns, each of the third signal lines connected to the organic light-emitting pixels of the second pixel column; and a plurality of fourth signal lines respectively connected to the third signal lines, each of the fourth signal lines to provide the first power supply voltage to a corresponding one of the third signal lines, each of the fourth signal lines connected substantially to a center portion of a corresponding one of the third signal lines.

A distance between the center portion of the first signal line and an end point of the first signal line may be about 40 percent to about 60 percent of a length of the first signal line. A distance between the center portion of the third signal line and an end point of the third signal line may be about 40 percent to about 60 percent of a length of the third signal line. Each of the organic light-emitting pixels may include an organic light-emitting device to receive the first power supply voltage and a second power supply voltage different from the first power supply voltage in order to emit light. The second power supply voltage may be lower than the first power supply voltage.

In accordance with one or more other embodiments, an organic light-emitting display panel includes a column of organic light-emitting pixels; a first signal line connected to the organic light-emitting pixels; and a second signal line connected to the first signal line at a predetermined point, wherein the second signal line is to provide a power supply voltage to the first signal line and wherein the predetermined point is between ends of the first signal line. The second signal line includes a first end connected to the first signal line and a second end connected to a power supply voltage line. A distance between the power supply voltage line and a first organic light-emitting pixel in the column may be less than a distance between the first organic light-emitting pixel and the predetermined point.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
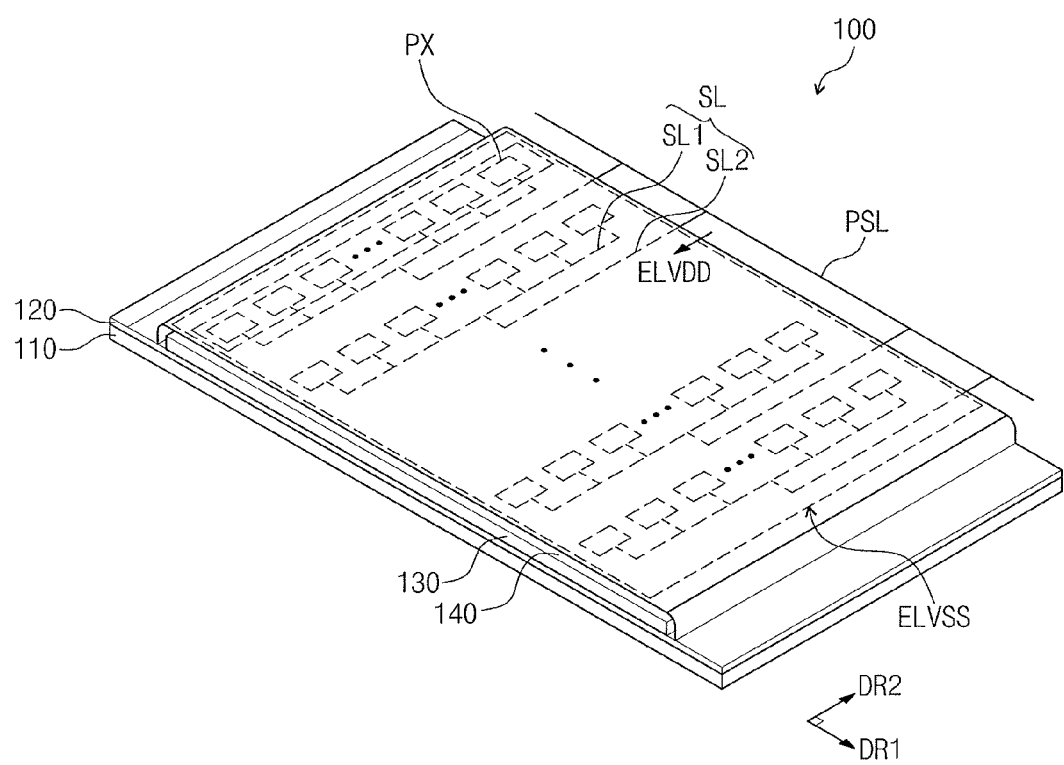
FIG. 1 illustrates an embodiment of an organic light-emitting display panel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light-emitting display panel 100 in an organic light-emitting display apparatus. As illustrated in FIG. 1, the organic light-emitting display panel 100 includes a protective film 110, a base member 120, a device layer 130, and an encapsulation layer 140. The device layer 130 is on the base member 120, and the encapsulation layer 140 covers the device layer 130. The organic light-emitting display panel 100 may further include a polarizing plate on the encapsulation layer 140.

The protective film 110 may be on a lower surface of the base member 120. In another embodiment, the protective film 110 may be omitted. The base member 120 may include at least one of polyimide, polyethylene terephthalate, polyethylene naphthalate, polyethersulfone, or fiber reinforced plastics.

The device layer 130 includes a plurality of pixels PX, a plurality of signal lines SL, a plurality of gate lines, and a plurality of data lines. The gate lines extend in a first direction DR1 and are arranged in a second direction DR2 perpendicular to the first direction DR1. The data lines intersect and are insulated from the gate lines. The data lines extend in the second direction DR2 and are arranged in the first direction DR1. Each pixel PX is connected to corresponding ones of the gate lines, data lines, and signal lines SL.

A scanning driving unit and a data driving unit may be arranged outside the organic light-emitting display panel 100. The scanning driving unit generates gate signals and sequentially outputs the gate signals to the gate lines. The data driving unit converts image data to data signals and outputs the data signals to the data lines. The data signals have voltage levels corresponding to gradation values of the image data.

Figure 2A:
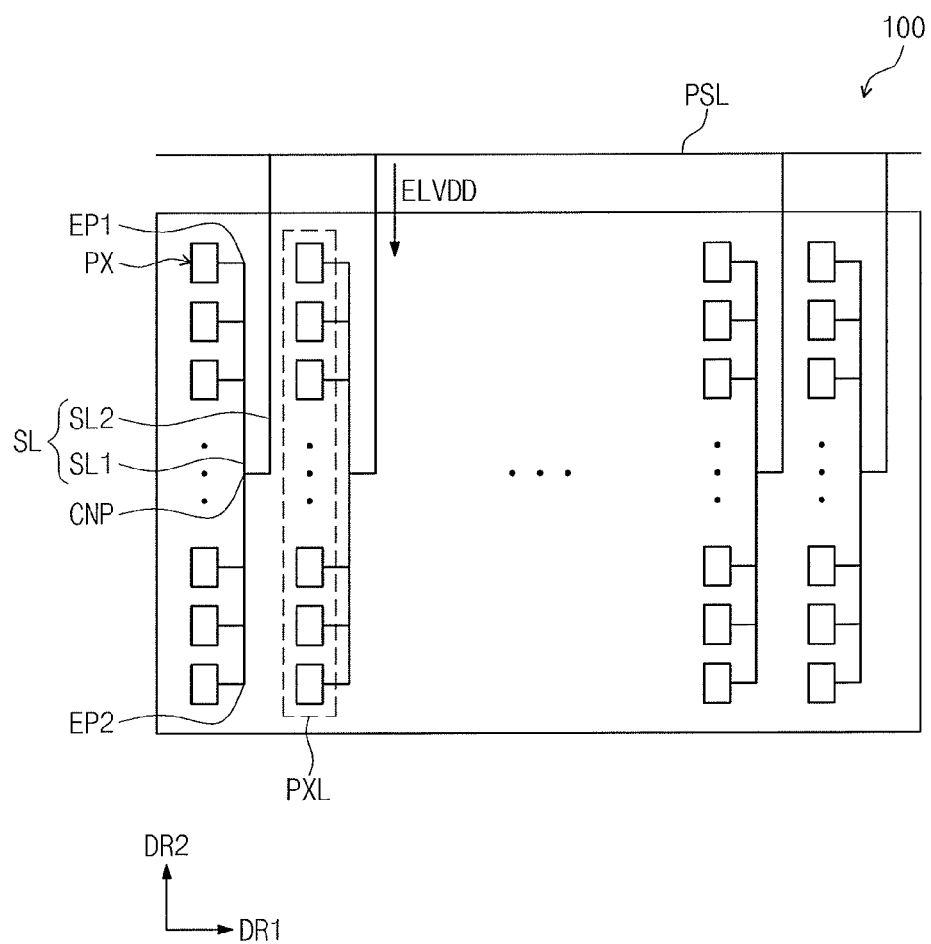
FIG. 2A illustrates a planar view of the organic light-emitting display panel.

FIG. 2A is a planar view of the organic light-emitting display panel 100. As illustrated in FIG. 2A, the display panel 100 includes a plurality of pixel columns PXL. Each pixel column PXL includes a plurality of pixels PX. The pixel columns PXL extend in the second direction DR2 and are arranged in the first direction DR1.

An organic light-emitting device in the organic light-emitting pixel PX receives a first power supply voltage ELVDD and a second power supply voltage ELVSS (see, e.g., FIG. 1) to emit light. The first power supply voltage ELVDD is different from the second power supply voltage ELVSS. For example, the second power supply voltage ELVSS may be lower than the first power supply voltage ELVDD.

Each signal line SL receives the first power supply voltage ELVDD from a signal supply line PSL and supplies the first power supply voltage ELVDD to a corresponding organic light-emitting device.

Each signal line SL includes a first signal line SL1 and a second signal line SL2. The first signal lines SL1 extend in the second direction DR2 and are arranged in the first direction DR1. The first signal lines SL1 are arranged to correspond to the pixel column PXL. Each pixel in the pixel column PXL is connected to a corresponding first signal line SL1.

Each first signal line SL1 includes a first end point EP1, a second end point EP2, and a connection point CNP. The first and second end points EP1 and EP2 are at respective end portions of each first signal line SL1. Each first signal line SL1 is connected to a corresponding second signal line SL2 at the connection point CNP.

Each second signal line SL2 is connected to a corresponding first signal line SL1 at the connection point CNP. Each second signal line SL2 receives the first power supply voltage ELVDD from the signal supply line PSL and provides the first power supply voltage ELVDD to a corresponding first signal line SL1.

The connection point CNP may be at a center portion of the first signal line SL1. For example, the distance between the connection point CNP and the first end point EP1 may be about 40 percent to about 60 percent of that between the first end point EP1 and the second end point EP2. In another embodiment, the connection point CNP may be any other intervening location between the ends of the first signal line SL1.

When the connection point CNP is disposed as illustrated in FIG. 2A, a whitening event, in which a display screen adjacent to the signal supply line PSL is whitened, may be reduced or eliminated.

Figure 2B:
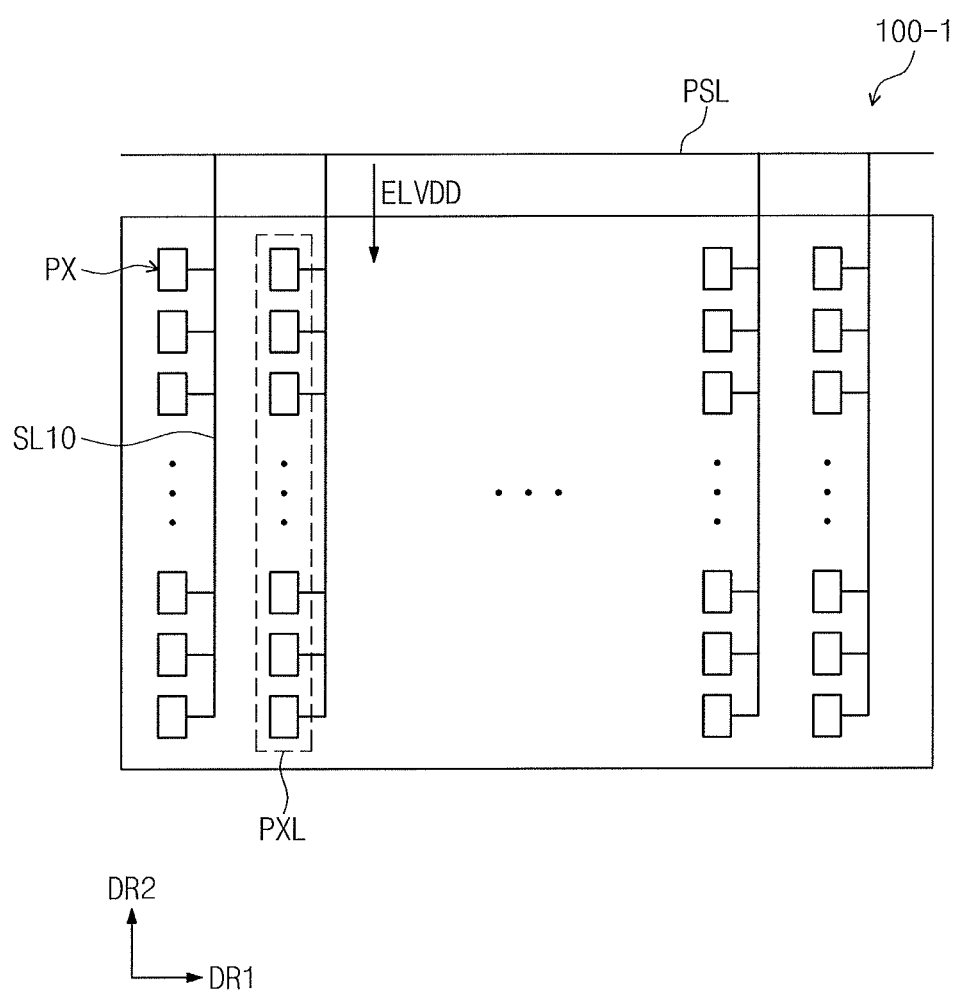
FIGS. 2B and 2C illustrate related art organic light-emitting display panels.
Figure 2C:
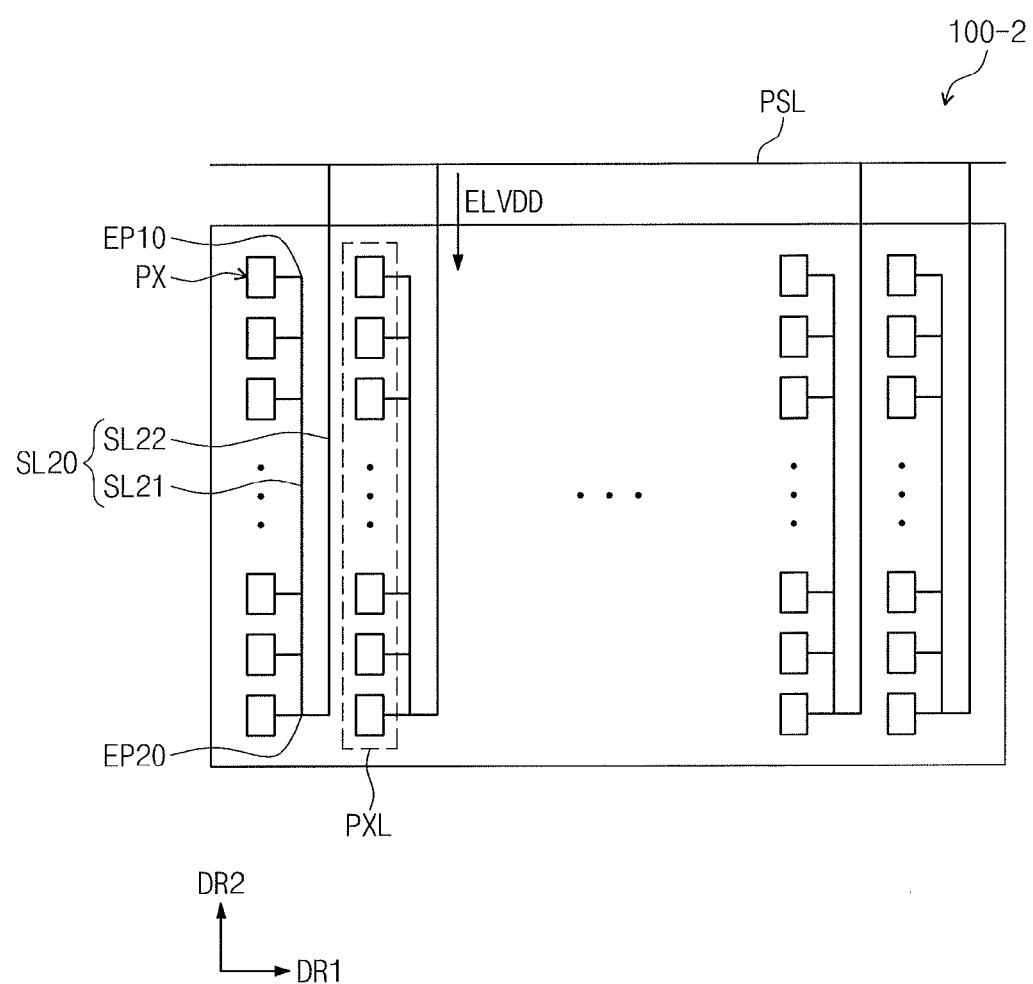

FIGS. 2B and 2C are planar views of related-art organic light-emitting display panels 100-1 and 100-2. Referring to FIG. 2B, signal lines SL10 extend in the second direction DR2. Each pixel PX in a same pixel column PXL is connected to the same signal line SL10. In this case, since the signal supply line PSL is close to a point at which the first power supply voltage ELVDD starts to be supplied to the pixel column PXL, a display area adjacent to the signal supply line PSL is whitened due to a high voltage and a magnetic field of signal supply line PSL, e.g., a whitening event occurs.

In contrast, in the panel of FIG. 2A, the point at which the first power supply voltage ELVDD starts to be supplied to each pixel PX is the connection point CNP located at the center (or another intervening position between ends of) the first signal line SL1. Since the point at which the first supply voltage ELVDD starts to be supplied to each pixel column PXL is spaced a predetermined distance from the signal supply line PSL, a whitening effect does not occur. As a result, the organic light-emitting display panel 100 may generate images of higher quality compared to the panel in FIG. 2B.

When the connection point CNP is disposed as illustrated in FIG. 2A, power loss due to voltage drop (IR drop) may be reduced in comparison with the related-art panel in FIG. 2C. For example, the signal lines SL in FIG. 2A and the signal lines SL20 in FIG. 2C may be made of a metallic material. The signal lines SL or SL20 for transferring current have resistances in proportion to their lengths. Especially for the signal lines SL or SL20 having increased in length and resistance, voltage levels at respective end points of each signal line SL or SL20 are different from each other. This phenomenon may be explained by the equation of $V=I \times R$. Thus, as resistance R increases, the potential difference V increases.

Referring to FIGS. 2A and 2C, the length of the signal line SL, which is connected from the signal supply line PSL to pixels arranged at respective ends of the pixel column PXL, is smaller than the length of the signal line SL20 connected from the signal supply line PSL to pixels arranged at respective ends of the pixel column PXL. For example, the second signal line SL2 may have a length of X, and the first signal line SL1 may have a length of Y in FIG. 2A. In this case, the distance between the connection point CNP and the first end point EP1 or the second end point EP2 may be about Y/2. In this case, the length of each signal line SL from the signal supply line PSL to the first end point EP1 or the second end point EP2 is about X+Y/2.

Referring to FIG. 2C, the length of the second signal line SL22 is 2X, and the length of the first signal line SL21 is Y under the same conditions as mentioned above. Therefore, the length of each signal line SL20 from the signal supply line PSL to a first end point EP10 is 2X+Y.

Since X+Y/2 is about half of 2X+Y, the voltage drop of the signal line SL according to one embodiment is reduced by about half compared to that of the signal line SL20 in FIG. 2C. Since power consumption is reduced when the voltage drop is decreased, a more efficient organic light-emitting display panel may be provided. Therefore, the display panel 100 in FIG. 2A may have an excellent display quality, while consuming less power, compared to the panels in FIGS. 2B and 2C.

Figure 3:
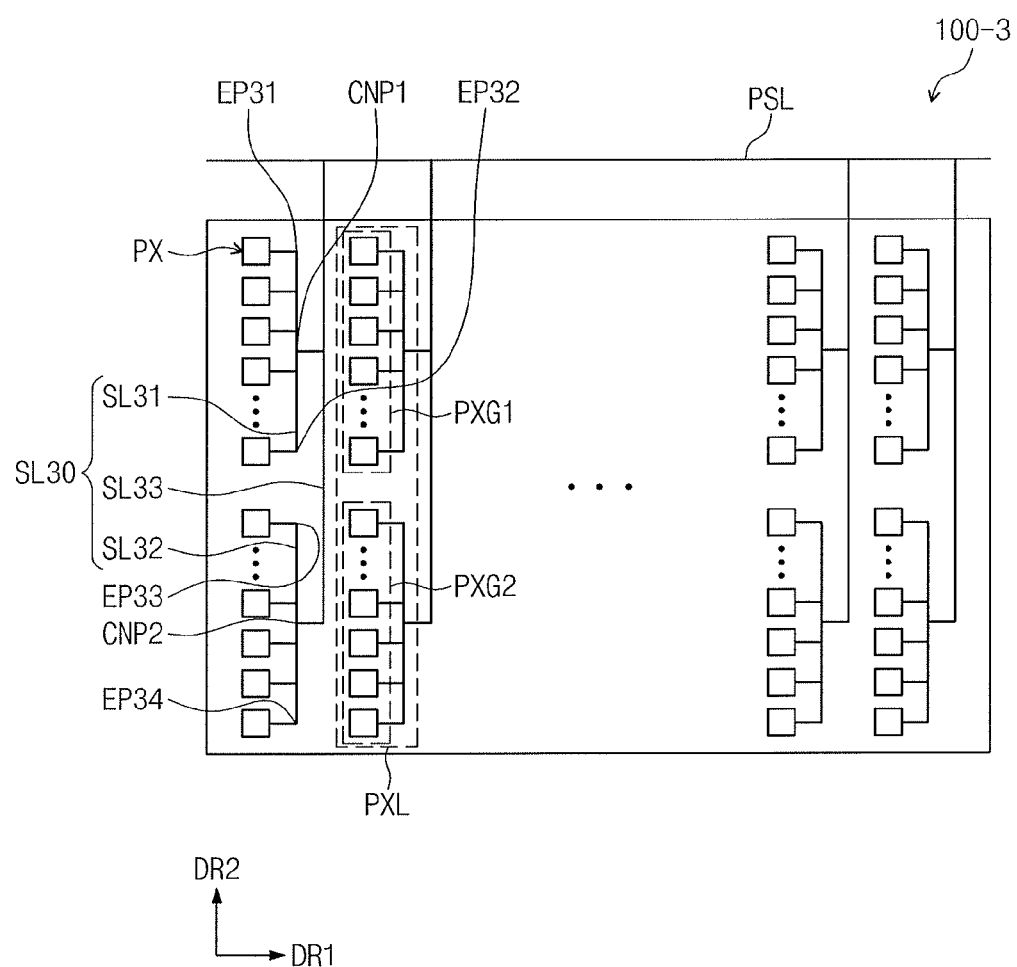
FIG. 3 illustrates another embodiment of an organic light-emitting display panel.

FIG. 3 is a planar view of another embodiment of an organic light-emitting display panel 100-3. As illustrated in FIG. 3, each pixel column PXL includes a first pixel group PXG1 and a second pixel group PXG2. Each of the first and second pixel groups PXG1 and PXG2 includes a plurality of organic light-emitting pixels PX.

Each signal line SL30 includes a first signal line SL31, a second signal line SL32, and a third signal line SL33. The first and second signal lines SL31 and SL32 extend in the second direction DR2 and are arranged in the first direction DR1. Each first signal line SL31 is disposed to correspond to the first pixel group PXG1. Each second signal line SL32 is disposed to correspond to the second pixel group PXG2.

Each pixel in the first pixel group PXG1 is connected to a corresponding first signal line SL31. Each pixel in the second pixel group PXG2 is connected to a corresponding second signal line SL32.

Each first signal line SL31 includes a first end point EP31, a second end point EP32, and a first connection point CNP1. Each second signal line SL32 includes a third end point EP33, a fourth end point EP34, and a second connection point CNP2. The first and second end points EP31 and EP32 are at end portions of each first signal line SL31. The third and fourth end points EP33 and EP34 are at end portions of each second signal line SL32.

Each first signal line SL31 is connected to a corresponding third signal line SL33 at the first connection point CNP1. Each second signal line SL32 is connected to a corresponding third signal line SL33 at the second connection point CNP2.

Each third signal line SL33 is connected to a corresponding first signal line SL31 and a corresponding second signal line SL32. A point at which the third signal line SL33 is connected to the first signal lines SL31 is defined as the first connection point CNP1. A point at which the third signal line SL33 is connected to the second signal lines SL32 is defined as the second connection point CNP2.

Each third signal line SL33 receives the first power supply voltage ELVDD from the signal supply line PSL and provides the first power supply voltage ELVDD to a corresponding first signal line SL31 and a corresponding second signal line SL32.

The first connection point CNP1 is at a center portion of the first signal line SL31. The second connection point CNP2 is at a center portion of the second signal line SL32. In another embodiment, the first and/or second connection points may be at any other intervening location between the ends of respective ones of the first and second signal lines SL31 and SL32.

In one embodiment, the distance between the first connection point CNP1 and the first end point EP31 may be about 40 percent to about 60 percent of the distance between the first end point EP31 and the second end point EP32. The distance between the second connection point CNP2 and the third end point EP33 may be about 40 percent to about 60 percent of the distance between the third end point EP33 and the fourth end point EP34. The effects of the structure of the signal lines SL30 illustrated in FIG. 3 may be the same as in FIG. 2A.

Figure 4:
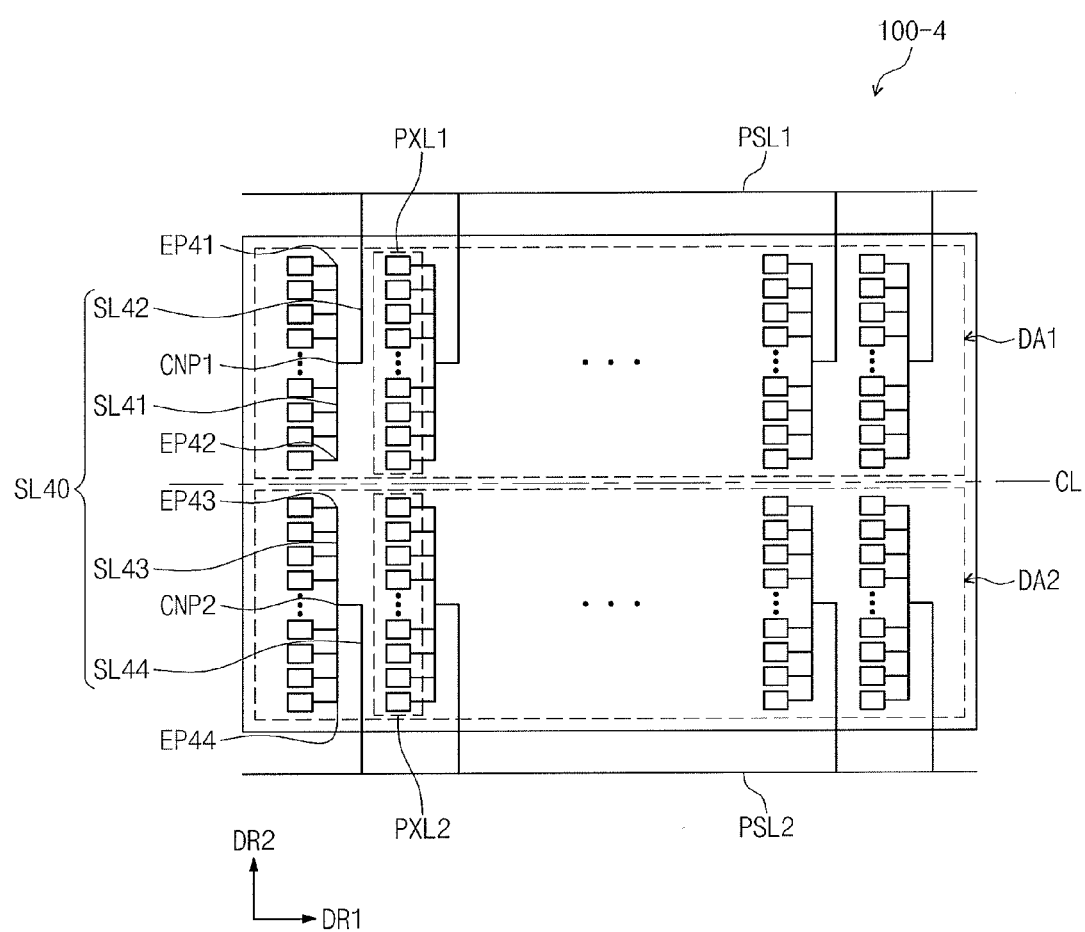
FIG. 4 illustrates another embodiment of an organic light-emitting display panel.

FIG. 4 is a planar view of another embodiment of an organic light-emitting display panel 100-4. As illustrated in FIG. 4, the organic light-emitting display panel 100-4 includes a first display area DA1 for displaying an image and a second display area DA2 for displaying an image. The second display area DA2 is adjacent to the first display area DA1. The first display area DA1 is divided from the second display area DA2 by a boundary line CL.

A portion of the organic light-emitting display panel 100-4 corresponding to the first display area DA1 includes a plurality of first pixel columns PXL1. Each first pixel column PXL1 includes a plurality of pixels PX. The first pixel columns PXL1 extend in the second direction DR2 and are arranged in the first direction DR1. A portion of the organic light-emitting display panel 100-4 corresponding to the second display area DA2 includes a plurality of second pixel columns PXL2. Each second pixel column PXL2 includes a plurality of pixels PX. The second pixel columns PXL2 extend in the second direction DR2 and are arranged in the first direction DR1.

An organic light-emitting device in the organic light-emitting pixel PX receives the first power supply voltage ELVDD and the second power supply voltage ELVSS (see, e.g., FIG. 1) to emit light. The first power supply voltage ELVDD is different from the second power supply voltage ELVSS. For example, the second power supply voltage ELVSS may be lower than the first power supply voltage ELVDD.

Each signal line SL40 receives the first power supply voltage ELVDD from signal supply lines PSL1 and PSL2 and supplies the first power supply voltage ELVDD to a corresponding organic light-emitting device. Compared to the organic light-emitting display panels in FIG. 2A or 3, the organic light-emitting display panel in FIG. 4 includes an additional signal supply line.

Each signal line SL40 includes a first signal line SL41, a second signal line SL42, a third signal line SL43, and a fourth signal lines SL44. The first and second signal lines SL41 and SL42 are arranged on the first display area DA1. The third and fourth signal lines SL43 and SL44 are arranged on the second display area DA2.

The first signal lines SL41 extend in the second direction DR2 and are arranged in the first direction DR1. The first signal lines SL41 are arranged to correspond to the first pixel column PXL1. Each pixel in the first pixel column PXL1 is connected to a corresponding first signal line SL41.

Each first signal line SL41 includes a first end point EP41, a second end point EP42, and a first connection point CNP1. The first and second end points EP41 and EP42 are at respective end portions of each first signal line SL41. Each first signal line SL41 is connected to a corresponding second signal line SL42 at the first connection point CNP1.

Each second signal line SL42 is connected to a corresponding first signal line SL41 at the first connection point CNP1. Each second signal line SL42 receives the first power supply voltage ELVDD from a first signal supply line PSL1 and provides the first power supply voltage ELVDD to a corresponding first signal line SL41.

The first connection point CNP1 may be at a center (or other intervening) portion of the first signal line SL41. The distance between the first connection point CNP1 and the first end point EP41 may be, for example, about 40 percent to about 60 percent of the distance between the first end point EP41 and the second end point EP42.

The third signal lines SL43 extend in the second direction DR2 and are arranged in the first direction DR1. The third signal lines SL43 are arranged to correspond to the second pixel column PXL2. Each pixel in the second pixel column PXL2 is connected to a corresponding third signal line SL43.

Each third signal line SL43 includes a third end point EP43, a fourth end point EP44, and a second connection point CNP2. The third and fourth end points EP43 and EP44 are at respective end portions of each third signal line SL43. Each third signal line SL43 is connected to a corresponding fourth signal line SL44 at the second connection point CNP2.

Each fourth signal line SL44 is connected to a corresponding third signal line SL43 at the second connection point CNP2. Each fourth signal line SL44 receives the first power supply voltage ELVDD from a second signal supply line PSL2 and provides the first power supply voltage ELVDD to a corresponding third signal line SL43.

The second connection point CNP2 may be at a center (or other intervening) portion of the third signal line SL43. The distance between the second connection point CNP2 and the third end point EP43 may be, for example, about 40 percent to about 60 percent of that between the third end point EP43 and the fourth end point EP44.

In the case where the signal supply lines PSL1 and PSL2 are respectively arranged at an upper portion and a lower portion of the organic light-emitting display panel 100-4 as illustrated in FIG. 4, the rate of supplying the first power supply voltage ELVDD to the pixels is increased, compared to the embodiments in FIG. 2A or 3, since the signal lines SL40 through which current flows are short. Therefore, the organic light-emitting display panel according to the embodiment in FIG. 4 may be operated at high speed compared to the organic light-emitting display panel illustrated in FIG. 2A or 3, and is thus suitable for an organic light-emitting display apparatus for digitally transmitting data signals.

Figure 5:
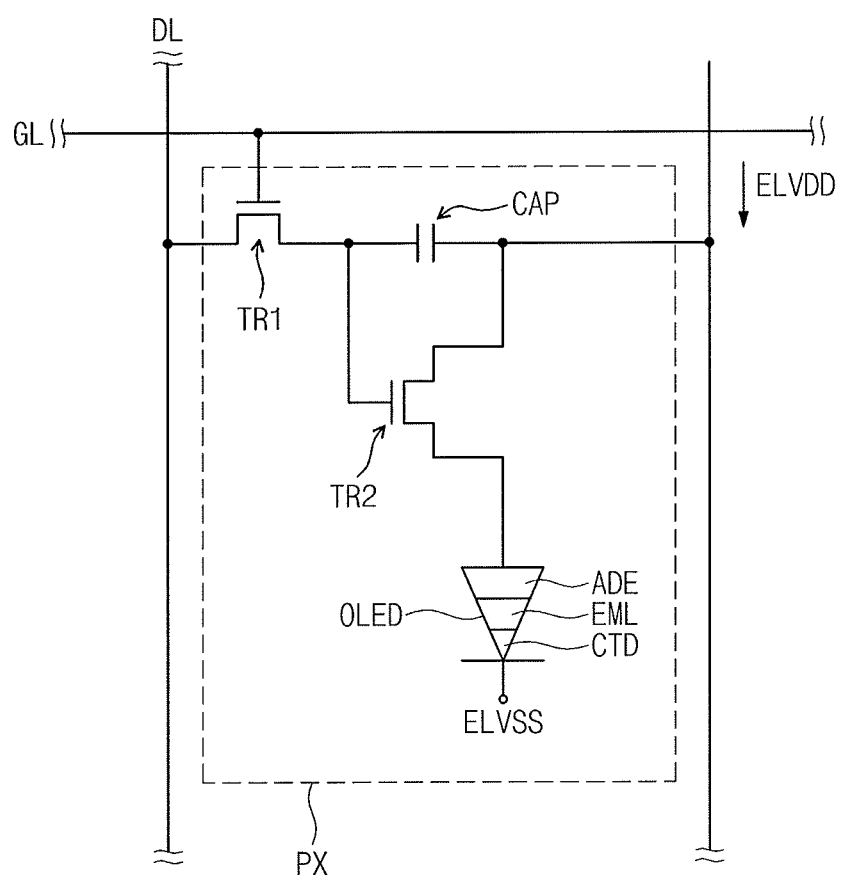
FIG. 5 illustrates an example of a circuit of an organic light-emitting pixel.

FIG. 5 illustrates an example of an equivalent circuit of an organic light-emitting pixel PX, which, for example, may be included in any of the embodiments of the aforementioned display panels. As illustrated in FIG. 5, each pixel PX includes an organic light-emitting device (OLED) and a circuit for controlling the OLED. The circuit includes a first transistor TR1, a second transistor TR2, and a capacitor CAP. The equivalent circuit of the pixel PX may have a different arrangement of transistors and/or capacitors in another embodiment.

The first transistor TR1 includes a control electrode connected to a gate line GL, an input electrode connected to a data line DL, and an output electrode. The first transistor TR1 outputs a data signal input to the data line DL in response to a gate signal applied to the gate line GL.

The capacitor CAP includes a first electrode connected to the first transistor TR1 and a second electrode for receiving the first power supply voltage ELVDD. The capacitor CAP is charged with a voltage corresponding to the data signal from the first transistor TR1.

The second transistor TR2 includes a control electrode connected to the output electrode of the first transistor TR1 and the first electrode of the capacitor CAP, an input electrode for receiving the first power supply voltage ELVDD, and an output electrode. The output electrode of the second transistor TR2 is connected to the OLED. The second transistor TR2 controls current that flows through the OLED according to the voltage stored in the capacitor CAP.

The OLED includes an anode ADE connected to the second transistor TR2 to receive the first power supply voltage ELVDD, and a cathode CTD for receiving the second power supply voltage ELVSS. Furthermore, the OLED may include an emission layer EML between the anode ADE and the cathode CTD. The OLED emits light while the second transistor TR2 is turned on.

By way of summation and review, an organic light-emitting display panel has pixels which include organic light-emitting devices. Each organic light-emitting device is equipped with electrodes for applying a power supply voltage to an organic emission layer. Various types of wirings may be used to apply the power supply voltage. The wirings have a certain resistance. As a result, when current flows through the wirings, a voltage drop phenomenon may occur due to the resistance. The effects may become more pronounced with the size of the display panel.

In accordance with one or more of the aforementioned embodiments, power consumption due to a voltage drop may be reduced based on the location of the connection between a power line and pixels in the display panel. Furthermore, a whitening event may be avoided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light-emitting display panel, comprising:
    a plurality of pixel columns, each of the pixel columns including a plurality of organic light-emitting pixels;
    a plurality of first signal lines arranged to correspond to the pixel columns, each of the first signal lines connected to the organic light-emitting pixels of a corresponding pixel column; and
    a plurality of second signal lines connected one to one to the first signal lines, the second signal lines to provide a first power supply voltage to corresponding ones of the first signal lines, wherein each of the second signal lines is connected substantially to a center portion of the corresponding first signal line.

2. The display panel as claimed in claim 1, wherein a distance between the center portion and an end point of the first signal line is about 40 percent to about 60 percent of a length of the first signal line.

3. The display panel as claimed in claim 2, wherein each of the organic light-emitting pixels includes an organic light-emitting device to receive the first power supply voltage and a second power supply voltage different from the first power supply voltage in order to emit light.

4. The display panel as claimed in claim 3, wherein the second power supply voltage is lower than the first power supply voltage.

5. The display panel as claimed in claim 4, further comprising:
    a plurality of data lines to provide data signals corresponding to the organic light-emitting pixels; and
    a plurality of gate lines intersecting and insulated from the data lines, the gate lines to provide gate signals corresponding to the organic light-emitting pixels.

6. The display panel as claimed in claim 1, wherein the organic light-emitting pixels of each pixel column are to receive the first power supply voltage from a respective one of the second signal lines through a respective one of the first signal lines.

* * * * *